US010625279B2

(12) United States Patent
L'Henaff et al.

(10) Patent No.: US 10,625,279 B2
(45) Date of Patent: Apr. 21, 2020

(54) TOUCH CONTROLLED SHOWER HEAD (71) Applicant: AS AMERICA, INC., Piscataway, NJ (US)

(72) Inventors: Jean-Jacques L'Henaff, New Canaan, CT (US); Walter Pitsch, Washington, NJ (US); Verne Myers, Clinton, NJ (US); Xiaojing Ye, Edison, NJ (US); Greg Reinecker, Brooklyn, NY (US); Emilie Williams, South Plainfield, NJ (US); Alanna Wing Libbrecht, Madison, NJ (US); Brian P. Kalember, Indianapolis, IN (US); Gabriela Ravassa, Brooklyn, NY (US); Ki Bok Song, Plainview, NY (US)

(73) Assignee: AS America, Inc., Piscataway, NJ (US)

( * ) Notice: Subject to any disclaimer, the term of this patent is extended or adjusted under 35 U.S.C. 154(b) by 4 days.

(21) Appl. No.: 15/865,365

(22) Filed: Jan. 9, 2018

(65) Prior Publication Data
US 2018/0193852 A1     Jul. 12, 2018

Related U.S. Application Data (60) Provisional application No. 62/444,008, filed on Jan. 9, 2017.

(51) Int. Cl.
*B05B 1/18* (2006.01)
*B05B 1/16* (2006.01)
(Continued)

(52) U.S. Cl.
CPC ............ *B05B 1/185* (2013.01); *B05B 1/1681* (2013.01); *B05B 12/002* (2013.01); *G06F 3/044* (2013.01);
(Continued)

(58) Field of Classification Search
CPC ....... B05B 1/185; B05B 1/681; B05B 12/002; B05B 1/1681; B05B 1/1636; B05B 1/18;
(Continued)

(56) References Cited

U.S. PATENT DOCUMENTS 8,365,767 B2    2/2013   Davidson et al.
8,991,432 B2 *  3/2015   Zhou ..................... B05B 1/18
                                                      239/444
(Continued)

FOREIGN PATENT DOCUMENTS

CA       2800069 A1    11/2011
CN     205013801 U      2/2016
(Continued)

OTHER PUBLICATIONS

International Search Report and Written Opinion dated Mar. 7, 2018 for International Patent Application No. PCT/US2018/012864, 9 pages.

*Primary Examiner* — Steven J Ganey
(74) *Attorney, Agent, or Firm* — Tyler A. Stevenson; Anna-lisa L. Gallo (57) ABSTRACT

A shower head includes a fluid inlet configured to connect to a fluid source, a spray face having a plurality of fluid outlets, a fluid flow path from the fluid source to the spray face, and a diverter positioned in the fluid flow path which is configured to adjust the flow of fluid through the fluid flow path, the diverter being switchable between different spray configurations associated with different spray modes of the shower head. A user interface for selecting the shower spray mode is positioned on a peripheral portion of the spray face, the user interface including one or more touch-sensitive devices configured to receive one or more touch inputs from a user during operation of the shower head and configured to cause the diverter to switch from one spray configuration
(Continued)

to another spray configuration in response to receiving the one or more touch inputs from the user.

15 Claims, 6 Drawing Sheets

(51) Int. Cl.
    *G08C 17/02*     (2006.01)
    *G06F 3/044*     (2006.01)
    *G06F 3/045*     (2006.01)
    *H03K 17/96*     (2006.01)
    *B05B 12/00*     (2018.01)
    *B05B 1/30*     (2006.01)

(52) U.S. Cl.
    CPC .............. *G06F 3/045* (2013.01); *G08C 17/02* (2013.01); *H03K 17/962* (2013.01); *H03K 17/9645* (2013.01); *B05B 1/1636* (2013.01); *B05B 1/18* (2013.01); *B05B 1/3026* (2013.01); *B05B 12/00* (2013.01)

(58) Field of Classification Search
    CPC ......... B05B 1/306; B05B 12/00; G06F 3/044; G06F 3/045; G08C 17/02; H03K 17/962; H03K 17/9645
    USPC ..................... 239/69, 73, 391, 444, 446–449
    See application file for complete search history.

(56) References Cited

U.S. PATENT DOCUMENTS

| | | | |
|---|---|---|---|
| 9,387,493 B2* | 7/2016 | Lev | ........................ B05B 1/1636 |
| 9,632,514 B2 | 4/2017 | Marty et al. | |
| 2007/0246550 A1 | 10/2007 | Rodenbeck et al. | |
| 2013/0062422 A1 | 3/2013 | Marty et al. | |
| 2013/0075483 A1 | 3/2013 | Marty et al. | |
| 2013/0119286 A1 | 5/2013 | Zhou et al. | |
| 2015/0153744 A1 | 6/2015 | Didion et al. | |
| 2015/0208152 A1 | 7/2015 | Hanna et al. | |
| 2015/0218784 A1 | 8/2015 | Mazz et al. | |
| 2017/0050201 A1 | 2/2017 | Deivasigamani et al. | |
| 2017/0087563 A1* | 3/2017 | Lin | ........................ F16K 11/044 |
| 2017/0320072 A1* | 11/2017 | Zheng | ................... B05B 1/1636 |

FOREIGN PATENT DOCUMENTS

| | | |
|---|---|---|
| CN | 105750104 A | 7/2016 |
| WO | 2011/106000 A1 | 9/2011 |

\* cited by examiner

TOUCH CONTROLLED SHOWER HEAD

CROSS-REFERENCE TO RELATED APPLICATIONS

This application claims priority to and the benefit of U.S. Provisional Patent Application No. 62/444,008, filed Jan. 9, 2017, which is incorporated herein by reference in its entirety.

FIELD OF THE INVENTION

The present invention generally relates to shower heads. In some embodiments, the present invention relates to touch controlled shower heads that are, for example, operable to output water in a plurality of different spray modes.

BACKGROUND OF THE INVENTION

Shower heads that employ nozzles to distribute water in a shower are known. Modern shower heads provide different spray modes that allow for a variety of spray pressures and patterns, including strong spray, massage spray, and gentle spray. The spray mode is typically selected using a manual dial on the shower head, which can be inconvenient for users with limited dexterity, for example. Touch-based controls, in which user commands are effected by placing or pressing one or more fingers on a touch sensitive device (e.g., screen), have seen a surge in popularity in recent years, particularly in consumer products such as smart phones, tablets, and other computing devices. Since these controls can be easier to use than conventional control mechanisms, it is desirable to provide shower head constructions that also leverage touch-based control technology.

SUMMARY OF THE INVENTION

It is an object of the present invention to provide embodiments of a new shower head that leverages touch-based control technology for spray mode selection. Still other objects and advantages of the present invention will be apparent from the present disclosure.

According to an embodiment of the present invention, a shower head having multiple spray modes can include a spray face for dispensing water, and a touch-sensitive device operable to select the spray mode based on user commands received at the device. In some embodiments, the spray mode can additionally, or alternatively, be selected using a remote selector mechanism operable to communicate user spray mode selection commands to the shower head. The remote selector mechanism may communicate wirelessly with the shower head, for example.

In certain embodiments, a shower head includes a fluid inlet configured to connect to a fluid source, a spray face including a plurality of fluid outlets, a fluid flow path configured to direct fluid from the fluid source to the spray face, a diverter positioned in the fluid flow path and configured to adjust the flow of fluid through the fluid flow path, the diverter being switchable between different spray configurations, each of the different spray configurations being associated with a different spray mode of the shower head, and a user interface on a peripheral portion of the spray face at least partially surrounding the plurality of fluid outlets, the user interface comprising one or more touch-sensitive devices configured to receive one or more touch inputs from a user during operation of the shower head. In some embodiments, the user interface is configured to cause the diverter to switch from one spray configuration to another spray configuration in response to receiving the one or more touch inputs from the user. In some embodiments, the user interface is shaped as a ring on the spray face surrounding the plurality of fluid outlets.

In some embodiments, the spray configurations includes a sequence of spray configurations in a predefined order, and the diverter is configured to switch from one spray configuration in the sequence of spray configurations to a next spray configuration in the sequence of spray configurations in the predefined order when the one or more touch-sensitive devices receives the one or more touch inputs from the user. For example, the sequence of spray configurations may include at least a first spray configuration, a second spray configuration, and a third spray configuration, and the diverter is configured to switch from the first spray configuration to the second spray configuration when the one or more touch-sensitive devices receives a first touch input from the user and configured to switch from the second spray configuration to the third spray configuration when the one or more touch-sensitive devices receives a second touch input from the user. In some embodiments, the one or more touch-sensitive devices include a resistive touch-sensitive device. In some embodiments, the one or more touch-sensitive devices include a capacitive touch-sensitive device.

In some embodiments, the diverter includes a diverter plate that is movable relative to the spray face in order to adjust the flow of fluid. Each of the different spray configurations of the diverter, in some embodiments, includes a different position of the diverter plate relative to the spray face. The different positions may include different rotational positions of the diverter plate. In some embodiments, the shower head further includes a motor (e.g., a DC motor) coupled to the diverter plate, the motor being configured to move the diverter plate relative to the spray face in response to the user interface receiving the touch inputs from the user. The motor may be operatively coupled to the diverter plate, for example, by one or more gears.

In some embodiments, the shower head includes an electric power source for supplying electrical power to one or more components of the shower head (e.g., to the DC motor, one or more touch-sensitive devices, electronic circuitry, etc.). In some such embodiments, the electric power source may include one or more removable batteries (e.g., rechargeable batteries). In some embodiments, the shower head includes a compartment for containing the one or more removable batteries. The compartment may include a latchable door that is positioned on an exterior of the shower head and accessible by the user. In some embodiments, the latchable door is configured to form a water-tight seal in order to protect the one or more removable batteries from moisture.

In yet further embodiments, a shower head according to the present invention may include a wireless module configured to communicate with a remote controller. The wireless module can configured to receive one or more wireless commands signals from the remote controller. In some such embodiments, the remote controller may receive user inputs to generate the wireless command signals in order to change the spray mode of the shower head. For example, in some embodiments, the shower head is configured to cause the diverter to switch from one spray configuration to another spray configuration in response to the wireless module receiving the one or more wireless command signals from the remote controller.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention can be embodied in different forms and thus should not be construed as being limited to the embodiments set forth herein.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 3:
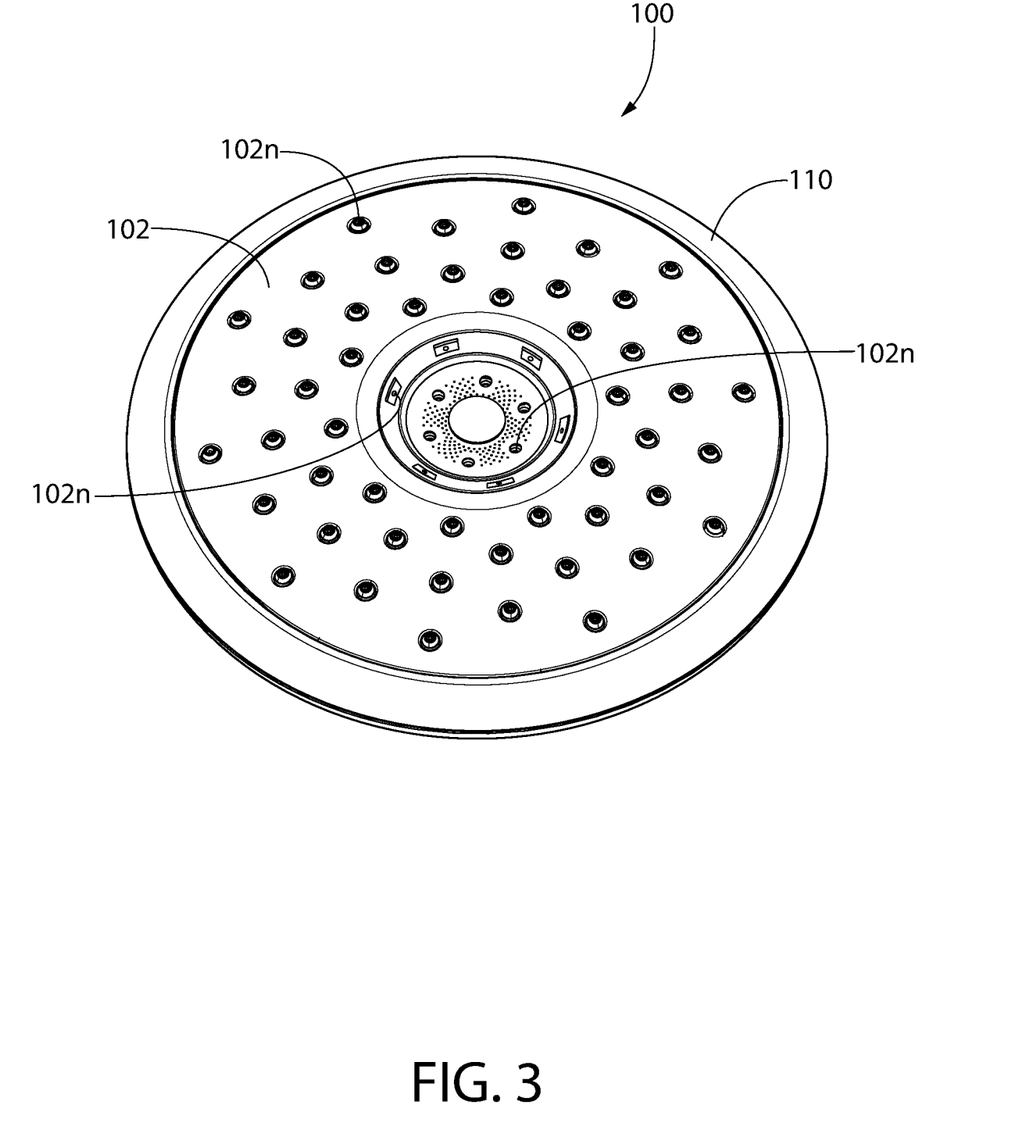
FIG. 3 is a front perspective view of the shower head of FIG. 1.
Figure 4:
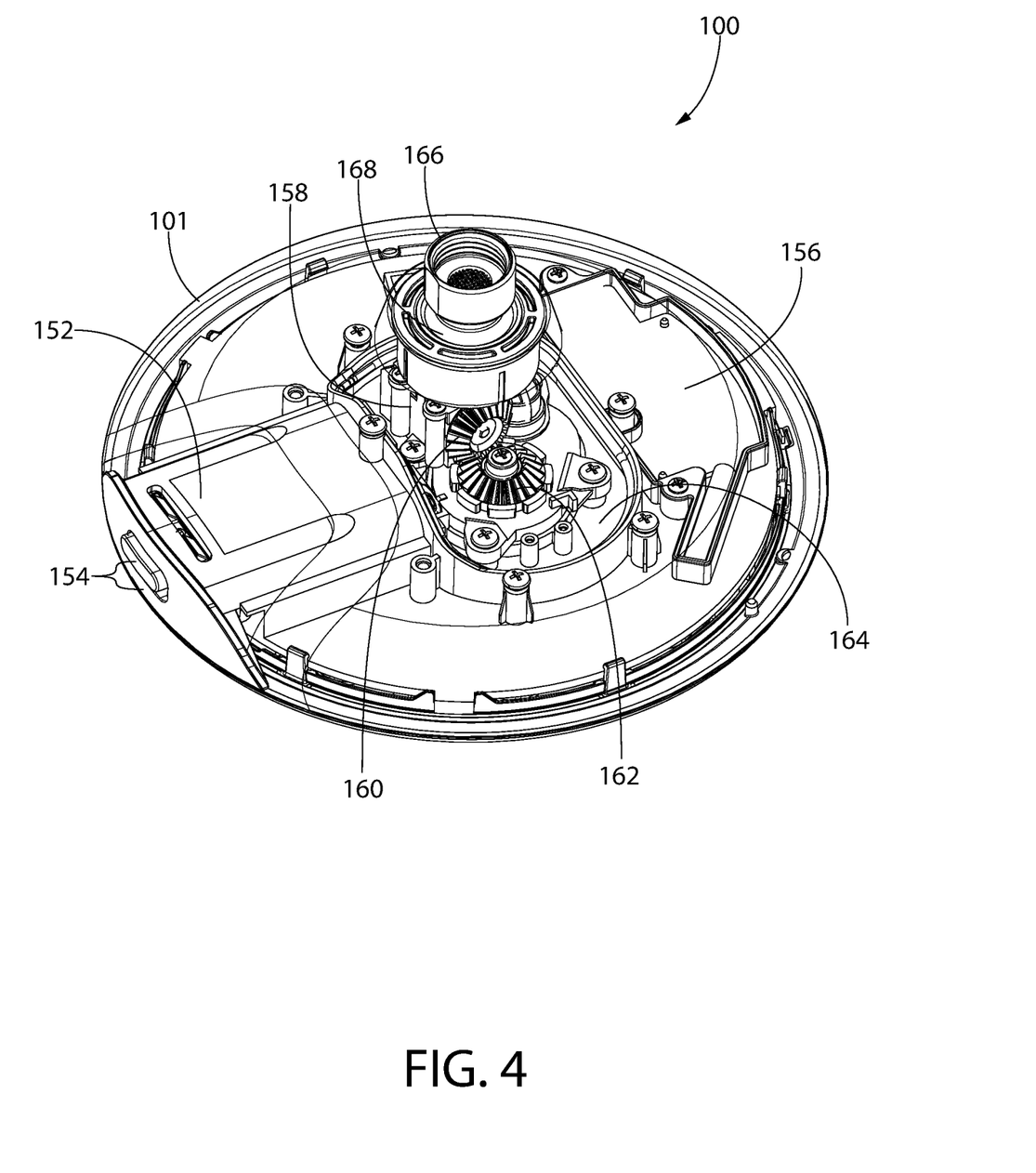
FIG. 4 is a rear view of the shower head of FIG. 1 with the rear portion of the enclosure removed to show interior components.
Figure 5:
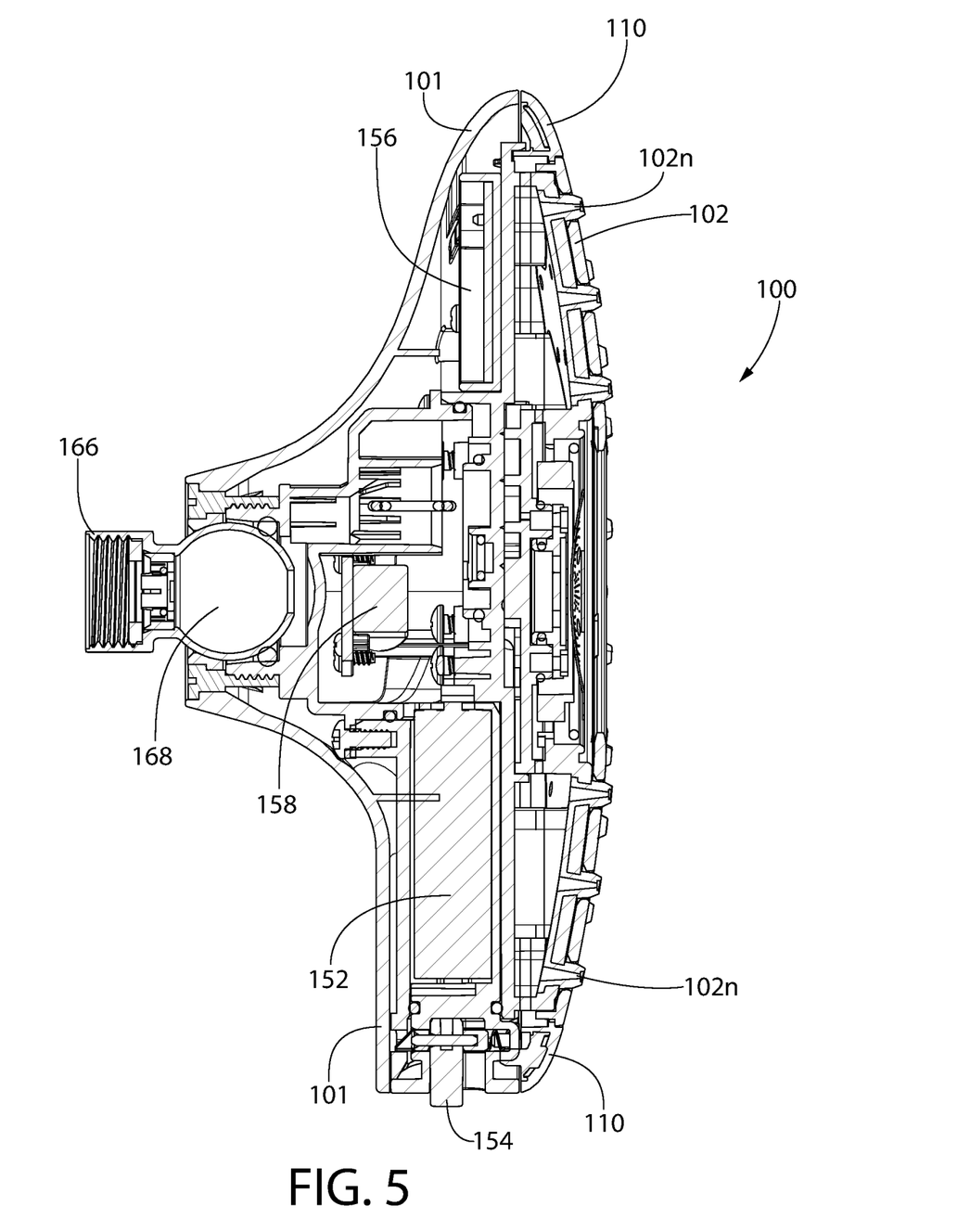
FIG. 5 is a cross-sectional view of the shower head of FIG. 1.

Referring to the drawings in detail, wherein like reference numerals indicate like elements throughout, there is shown in FIGS. 1 and 3-5 a shower head, generally designated 100, in accordance with exemplary embodiments of the present invention. Shower head 100, according to certain embodiments of the present invention, can include an enclosure 101 having a spray face 102 that includes a plurality of fluid outlets, for example, nozzles 102n, for outputting water received from a water source 90. Water source 90 may be, for example, a shower arm which extends from the wall of a shower and is connected to one or more plumbed water lines. As shown in FIGS. 4 and 5, shower head 100 in some embodiments may include a fluid inlet 166 which is configured to attach to water source 90 and receive fluid from water source 90. Fluid inlet 166, for example, may be positioned opposite of spray face 102 at a rear portion of shower head 100 and may include a connector (e.g., a threaded connector) for attaching to water source 90. In some embodiments, enclosure 101 may be coupled to fluid inlet 166 by a ball joint 168 which is configured to allow enclosure 101 to swivel and/or rotate with respect to fluid inlet 166 and water source 90. Nozzles 102n can be distributed across the surface of spray face 102, and aligned with corresponding water flow paths defined in shower head 100, allowing for different groups of the nozzles to be employed in different spray modes (e.g., those for soft spraying, jet spraying, and massage spraying). In some embodiments, for example, nozzles 102n may include different types of nozzles which are arranged or grouped at different portions of spray face 102. For example, in some embodiments, a nozzles of a first type (e.g., jet spraying) may be positioned proximate the center of spray face 102, nozzles of a second type (e.g., soft or normal spraying) may be positioned closer to the periphery of spray face 102, and a nozzles of a third type (e.g., massage spraying) may be positioned between the first and second types of nozzles. Water may be output from one or more of these nozzle types depending on the selected spray mode.

Figure 1:
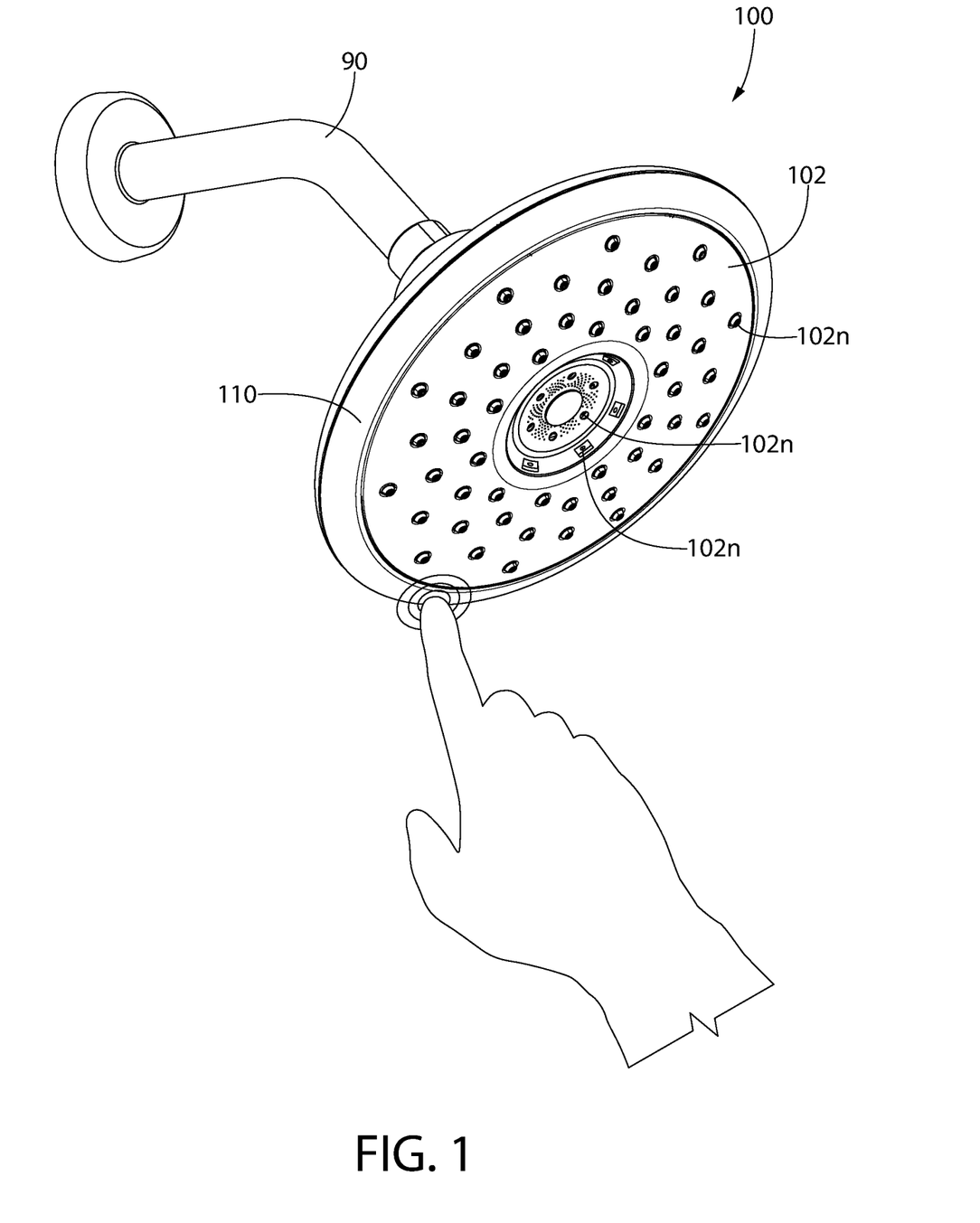
FIG. 1 is a perspective view of a shower head in accordance with an embodiment of the present invention mounted to a shower neck and being touch controlled by a user.

Shower head 100, in certain preferred embodiments, includes a user interface 110 having one or more touch-sensitive devices operable to select the spray mode in response to user commands. In some embodiments, the user commands are provided when the user touches or taps the user interface during use of shower head 100, e.g., with one or more fingers as generally illustrated in FIG. 1. In some embodiments, user interface 110 is positioned on and may be flush with spray face 102. As shown in FIGS. 1 and 3, for example, user interface 110 can be shaped as a ring that encircles the periphery of spray face 102. User interface 110, in some embodiments, surrounds some or all of nozzles 102n. In some embodiments, positioning user interface 110 along a peripheral portion of spray face 102 may allow the user to easily access user interface 110 and to control shower head 100 without, for example, blocking the flow of water being sprayed from nozzles 102n. In some such embodiments, the entirety of user interface 110 can be touch-sensitive and configured to detect user commands. For example, in some embodiments, user interface 110 includes a single touch-sensitive device which extends around the periphery of spray face 102. Alternatively, in certain embodiments, only a portion of user interface 110 (e.g., its top, bottom, side, and/or rear portion) can be configured to detect user touch commands, or, in the case where one or more other touch-sensitive devices are integrated with shower head 100 in lieu of user interface 110, only those portions of the shower head (e.g., spray face 102) integrated with such devices can be configured to detect user commands.

The one or more touch-sensitive devices of user interface 110 can be implemented via any suitable touch-based control technology. User interface 110, in some embodiments, includes one or more tactile or touch sensors configured to receive user commands via touch inputs from the user. For example, the one or more touch-sensitive devices may be configured to receive user commands when the user simply contacts the user interface with one or more fingers or other parts of the hand. In some embodiments, user interface 110 does not include any press buttons, dials, levers, or other movable controls which require manual actuation. In some embodiments, the one or more touch-sensitive devices includes a resistive touch device, for example, a resistance touch switch which is configured to detect a change in electrical resistance when the user comes into physical contact with the user interface. In other embodiments, the one or more touch-sensitive devices includes a capacitive touch device, for example, a capacitance switch which is configured to detect change in capacitance (e.g., an increase) when the user comes into physical contact with the user interface. For example, in some embodiments, the one or more touch-sensitive devices can include a resistive touch device, in which two substrates (e.g., plastic and/or glass) include respective coatings of conductive material disposed adjacent to one another, separated by a gap. When a force is applied to one of the substrates, the conductive coatings come into contact with each other, providing a change in electrical resistance that corresponds to the force. One or more processors coupled to the conductive materials can generate and transmit an appropriate signal to one or more valves in shower head 100 to adjust the water flow path and change the spray mode. As another example, user interface 110 can include a capacitive touch device, in which two substrates also include respective coatings of conductive material disposed adjacent to one another and separated by a gap. In this case, however, an electrostatic field is created between the two conductive coatings, which changes when an electrical charge is received at one of the substrates (e.g., via a user's touch). As in the first example, one or more processors coupled to the conductive materials can similarly generate and transmit an appropriate signal to adjust the water flow path in the shower head.

In some embodiments, user interface 110 has a touch surface for receiving user commands that is made from metal (e.g., stainless steel). In some embodiments, user interface 110 may include indicia which indicate the function (e.g., spray mode) when touched by the user. For example, in some embodiments where shower head 100 includes more than one touch-sensitive device, different touch-sensitive devices may be labelled with different indicia. The indicia include, for example, an image, word, or icon representing the function (e.g., a static image or icon). The indicia may be printed, embossed, molded, or otherwise permanently fixed on or proximate to the surface of user interface 110. In some embodiments, shower head 100 includes one or more lights (e.g., LEDs). The one or more lights may be arranged as one or more rings on spray face 102 or on user interface 110, for example. In some embodiments, the one or more lights may be configured change (e.g., change in color, lighting pattern, intensity, etc.) in response to the user interface 110 receiving the user touch commands and/or to indicate the selected spray mode. In other embodiments, the one or more lights may illuminate in a manner that is independent of the selected spray mode. In certain embodiments, user interface 110 is not or does not include a graphical user interface (e.g., does not include a touch screen, an electronic display screen, or dynamic graphics).

Exemplary embodiments of the shower head can include additional components for changing the spray mode, as shown, for example, in FIGS. 3 and 5. More particularly, shower head 100 can include a power source—e.g., one or more removable batteries—disposed in a compartment 152. In some embodiments, the power source may include, for example, a rechargeable battery pack, alkaline batteries, lithium-ion batteries, etc. In some embodiments, compartment 152 may be accessible by the user via a latchable door 154 included as part of enclosure 101. The latchable door 154 can be disposed on an exterior of shower head 100, for example, at a back portion or bottom of enclosure 101 in a manner that is easily user accessible. Shower head 100 can also include electrical and mechanical components powered by the batteries, including electronic circuitry, such as a printed circuit board ("PCB") 156, configured to process signals received from the one or more touch-sensitive devices of user interface 110. Shower head 100 can also include a motor, for example, direct current ("DC") motor 158 having a cylindrical gear, and a pair of conic gears—for example, an upper gear 160 that engages with the cylindrical gear, and a lower conic gear 162 that interoperates with a diverter positioned in the flow path between fluid inlet 166 and spray face 102 to toggle through the various spray modes. In some embodiments, the diverter is switchable between different spray configurations, each of the different spray configurations being associated with a different spray mode of the shower head 100. The diverter, in some embodiments, may include a diverter plate 164 (which can be, for example, a plastic, round-shaped plate or disc) having a plurality of openings or passages to allow the flow of fluid through the diverter plate 164. In some embodiments, the diverter plate 164 may be moved (e.g., rotated) with respect to spray face 102 to adjust the flow of fluid from fluid inlet 166 to spray face 102 in order to create different spray patterns and the various spray modes of shower head 100. For example, in some spray modes, diverter plate 164 may be moved (e.g., by motor 158) to one or more positions in which fluid flow is directed by the diverter plate 164 to only a subset of nozzles 102n. In other modes, diverter plate 164 may be moved back and forth (e.g., by motor 158) in order to cause a pulsing effect in the fluid flow.

The various components in shower head 100 can be mounted to the internal surface of the spray face 102 within the enclosure 101. It should be appreciated that shower head 100 in certain embodiments is configured to protect the electrical components (e.g., power source, PCB 156, motor 158, etc.) from moisture. For example, latchable door 154 may be configured to form a water-tight seal when closed to protect compartment 152. Moreover, apart from the fluid inlet 166 and nozzles 102n, shower head 100 in some embodiments may be sealed to prevent water from entering therein in order to protect the electrical components from moisture.

Figure 2A:
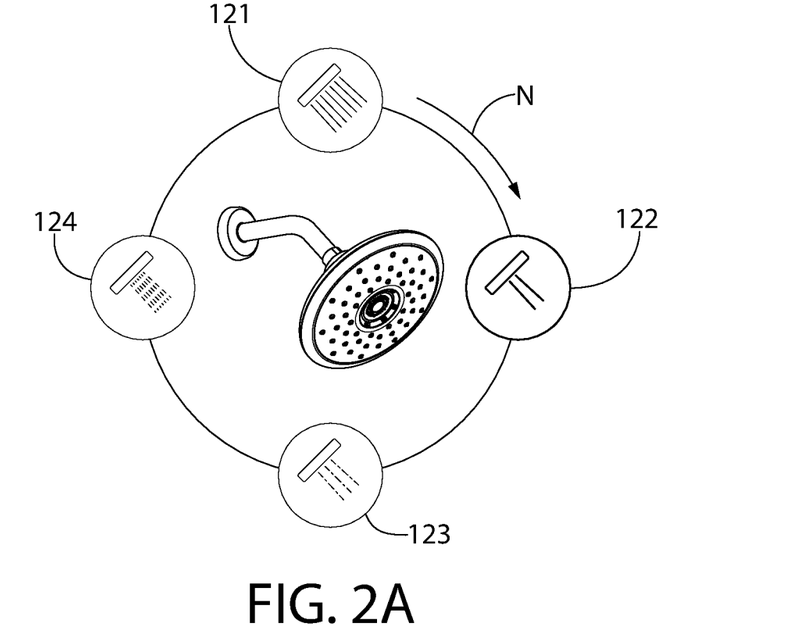
FIGS. 2A and 2B illustrate an example sequence of spray modes of a shower head in accordance with embodiments of the present invention.
Figure 2B:
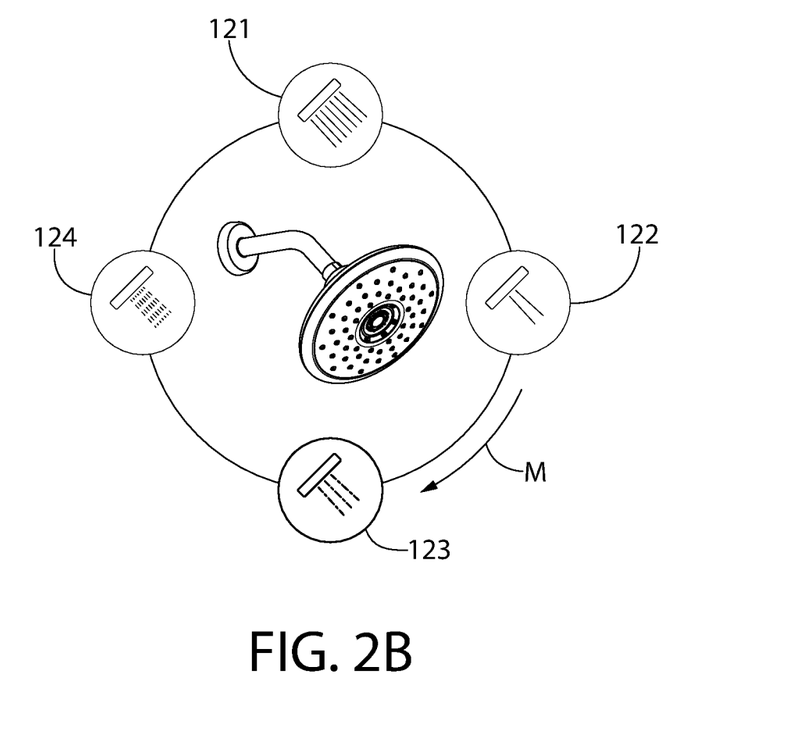

As shown in FIGS. 2A and 2B, shower head 100 in some embodiments can be operable in multiple spray modes, for example, but not limited to, spray modes 121 (e.g., a wide, soft spray), 122 (e.g., a jet spray), 123 (e.g., a massage spray), and 124 (e.g., a narrow, soft spray). It should be appreciated that shower head 100 can provide alternate, or additional, spray modes, including, for example, a pause mode (in which water flow is halted), a shampoo rinsing spray mode, a mixed spray mode, etc.

In certain embodiments, each user command (e.g., touch) received at user interface 110 can cause the shower head's spray mode to change, according to a predefined sequence. Referring again to FIGS. 2A and 2B, for example, when the shower head is in spray mode 121 (e.g., a wide spray) and a user command is received at user interface 110, the spray mode can be switched to the next mode in the sequence—spray mode 122 (e.g., a strong spray)—as indicated by the arrow labeled N. In some such embodiments, for example, upon receiving a user command at user interface 110, PCB 156 can transmit one or more electrical signals to DC motor 158 that cause the motor to rotate by a predefined amount. This can, in turn, drive the cylindrical gear and pair of conic gears 160, 162 to move or rotate diverter plate 164 to adjust the water flow path to the next spray mode. When an additional user command is subsequently received at touch-sensitive device 110, the spray mode can, for example, be switched to the next mode in the sequence—spray mode 123 (e.g., a massage spray)—as indicated by the arrow labeled M, and so on.

Alternatively, the touch-sensitive device(s) of user interface 110 can be configured to select or change the shower head's spray mode other than based on a predefined sequence. For example, the number of user commands (e.g., touches or taps) detected at the touch-sensitive device (e.g., single, double, triple tapping), the duration of each user command detected, and/or whether simultaneous user commands (e.g., two or more simultaneous touches or taps at different locations) are detected, can determine the spray mode. In yet other embodiments, a user may select different spray modes using different user gestures, for example, swiping one or more fingers along a portion of user interface 110, moving two fingers closer together (pinching gesture)

or away from each other while they are in contact with user interface 110, etc. As another example, each spray mode can be associated with a corresponding touch-sensitive device on shower head 100 such that a user command detected at one touch-sensitive device can cause the shower head to switch to the corresponding spray mode. For example, shower head 100 may include a separate touch-sensitive device for each different spray mode, and contact by the user to the touch-sensitive device will cause shower head 100 to switch that the corresponding spray mode. In such some embodiments, for example, user interface 110 may include a plurality of touch-sensitive devices, each being configured to active a different spray mode. The electronic circuitry and mechanical components, including the PCB, DC motor, gears, and diverter plate, can be similarly included and employed to adjust the water flow path or characteristics.

One or more touch-sensitive devices can additionally, or alternatively, be included in a different part of the shower assembly, such as, for example, a shower cover plate mounted to the wall. These touch-sensitive devices can be communicatively coupled (whether via wire or wirelessly) to one or more valves in shower head 100 that control the water flow paths therein. User commands received at these devices can similarly change the shower head spray mode.

In some embodiments, a remote control mechanism can additionally, or alternatively, be provided to select the shower head spray mode. For example, embodiments of the shower head 100 can include a wireless module that communicates with a remote control mechanism 175 (FIG. 6) via radio or other wireless technologies (WI-FI, Bluetooth, etc.). The remote control mechanism can include an interface (e.g., one or more resistive or capacitive touch sensors, push buttons, dials, or the like) configured to receive user commands. These commands can be transmitted to the shower head 100 and used to adjust the water flow path therein and change the spray mode. It should be appreciated that the remote control mechanism can be disposed at any suitable location, such as, for example, mounted to a wall proximate shower head 100.

Figure 6:
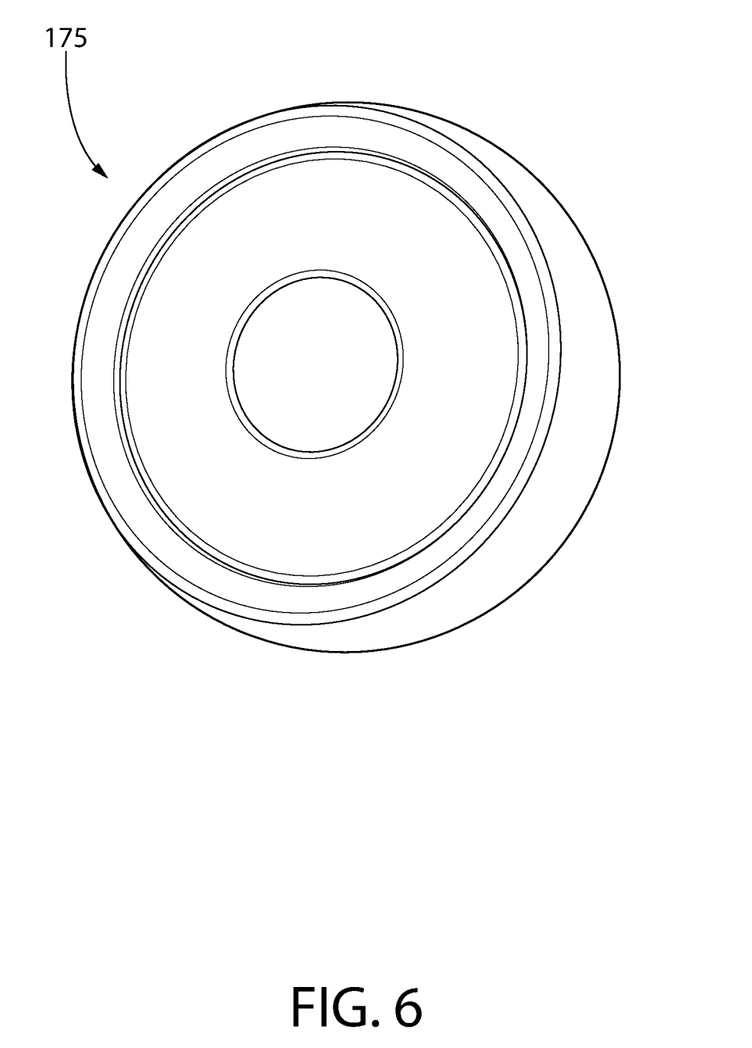
FIG. 6 is a perspective view of a remote controller for a shower head in accordance with a further embodiment of the present invention.

Embodiments of the shower head 100 configured to interoperate with a remote control mechanism 175 can include the same shower head components described in embodiments above, including touch-sensitive device 110 and the various electrical and mechanical components, and can additionally include one or more wireless modules (e.g., integrated in the PCB) configured to receive user command signals from the remote control mechanism. The spray mode can thus be selected using either touch-sensitive device 100 or the remote control mechanism. Alternatively, touch-sensitive device 110 can be absent, or substituted by one or more other elements, such as a decorative ring, where changes in the spray mode are effected only via the remote control mechanism 175. In either case, upon receiving a user command at the remote control mechanism, one or more signals are transmitted to the wireless module in the showerhead, which can, in turn, instruct the DC motor and the gears to rotate, and so forth as described above, to change the spray mode.

An example of an electrically controlled shower system that can benefit from embodiments of the present invention is discussed in detail in Chinese Patent No. CN 205013801U, which was published on Feb. 3, 2016, and which is incorporated herein in its entirety by reference. The shower head can, for example, be modified/enhanced with one or more touch-sensitive devices, in accordance with embodiments of the present invention, to select or change the spray mode.

It will thus be seen that the aspects, features and advantages made apparent from the foregoing are efficiently attained and, since certain changes may be made without departing from the spirit and scope of the invention, it is intended that all matter contained herein shall be interpreted as illustrative and not in a limiting sense.

It should be understood that various changes, substitutions, and alterations can be made herein without departing from the spirit and scope of the invention as defined by the appended claims. It should also be apparent that individual elements identified herein as belonging to a particular embodiment may be included in other embodiments of the invention. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, composition of matter, means, methods, or steps that perform substantially the same function or achieve substantially the same result as the corresponding embodiments described herein may be utilized according to the present invention.

What is claimed is:

1. A shower head comprising:
    a fluid inlet configured to connect to a fluid source;
    a spray face including a plurality of fluid outlets;
    a fluid flow path configured to direct fluid from the fluid source to the spray face;
    a diverter positioned in the fluid flow path and configured to adjust the flow of fluid through the fluid flow path, the diverter being switchable between different spray configurations, each of the different spray configurations being associated with a different spray mode of the shower head; and
    a user interface positioned on a peripheral portion of the spray face,
    wherein
    the user interface is ring-shaped, encircles the spray face, and surrounds the plurality of fluid outlets,
    the user interface comprises one or more touch-sensitive devices configured to receive one or more touch inputs from a user during operation of the shower head and configured to cause the diverter to switch from one spray configuration to another spray configuration in response to receiving the one or more touch inputs from the user,
    the one or more touch-sensitive devices comprise a resistive touch-sensitive device or a capacitive touch-sensitive device, and
    wherein the one or more touch-sensitive devices comprise two substrates each having coatings of conductive material disposed adjacent to one another and separated by a gap.

2. The shower head of claim 1, wherein the spray configurations include a sequence of spray configurations in a predefined order, and wherein the diverter is configured to switch from one spray configuration in the sequence of spray configurations to a next spray configuration in the sequence of spray configurations in the predefined order when the one or more touch-sensitive devices receives the one or more touch inputs from the user.

3. The shower head of claim 2, wherein the sequence of spray configurations includes at least a first spray configuration, a second spray configuration, and a third spray configuration, and wherein the diverter is configured to switch from the first spray configuration to the second spray configuration when the one or more touch-sensitive devices receives a first touch input from the user and configured to switch from the second spray configuration to the third spray configuration when the one or more touch-sensitive devices receives a second touch input from the user.

4. The shower head of claim 1, wherein an entirety of the user interface is touch-sensitive and configured to receive one or more touch inputs.

5. The shower head of claim 1, wherein the one or more touch-sensitive devices comprise a resistive touch-sensitive device.

6. The shower head of claim 1, wherein the one or more touch-sensitive devices comprise a capacitive touch-sensitive device.

7. The shower head of claim 1, wherein the diverter comprises a diverter plate that is movable relative to the spray face.

8. The shower head of claim 7, wherein each of the different spray configurations of the diverter comprises a different position of the diverter plate relative to the spray face.

9. The shower head of claim 7, further comprising a motor coupled to the diverter plate, the motor being configured to move the diverter plate relative to the spray face in response to the user interface receiving the touch inputs from the user.

10. The shower head of claim 9, wherein the motor is coupled to the diverter plate with one or more gears.

11. The shower head of claim 1, further comprising an electric power source for supplying electrical power to one or more components of the shower head.

12. The shower head of claim 11, wherein the electric power source comprises one or more removable batteries, wherein the shower head further comprises a compartment for containing the one or more removable batteries.

13. The shower head of claim 12, wherein the compartment includes a latchable door that is positioned on an exterior of the shower head and accessible by the user.

14. The shower head of claim 1, further comprising a wireless module configured to communicate with a remote controller, the wireless module configured to receive one or more wireless commands signals from the remote controller.

15. The shower head of claim 14, wherein the shower head is further configured to cause the diverter to switch from one spray configuration to another spray configuration in response to the wireless module receiving the one or more wireless command signals from the remote controller.

* * * * *